US008279011B2

United States Patent
Chang et al.

(10) Patent No.: US 8,279,011 B2
(45) Date of Patent: Oct. 2, 2012

(54) AMPLIFIER CIRCUIT AND METHOD OF SIGNAL AMPLIFICATION

(75) Inventors: Che-Ya Chang, Hsinchu (TW);
Yuan-Han Yang, Hsinchu County (TW);
Chun-Yuan Cheng, Nantou County (TW)

(73) Assignee: Modiotek Co., Ltd., Hsinchu (TW)

( * ) Notice: Subject to any disclaimer, the term of this patent is extended or adjusted under 35 U.S.C. 154(b) by 680 days.

(21) Appl. No.: 12/487,667

(22) Filed: Jun. 19, 2009

(65) Prior Publication Data

US 2010/0150357 A1    Jun. 17, 2010

Related U.S. Application Data

(60) Provisional application No. 61/138,125, filed on Dec. 17, 2008.

(51) Int. Cl.
*H03F 3/04* (2006.01)
(52) U.S. Cl. ............... 330/297; 330/127; 330/124 R; 327/536; 327/537
(58) Field of Classification Search ............ 330/297, 330/127, 124 R; 327/536, 537
See application file for complete search history.

(56) References Cited

U.S. PATENT DOCUMENTS

| | | | |
|---|---|---|---|
| 5,917,346 A * | 6/1999 | Gord | 327/101 |
| 6,218,904 B1 * | 4/2001 | Panther | 330/296 |
| 6,643,208 B2 * | 11/2003 | Yamagata et al. | 365/226 |
| 6,661,683 B2 | 12/2003 | Botker et al. | |
| 7,005,838 B2 * | 2/2006 | Tobita | 323/314 |
| 7,046,037 B1 * | 5/2006 | Tyhach et al. | 326/80 |
| 7,554,408 B2 * | 6/2009 | Chen et al. | 330/297 |
| 2004/0027108 A1 * | 2/2004 | Schreck | 323/282 |

FOREIGN PATENT DOCUMENTS

| | | |
|---|---|---|
| CN | 101754072 | 6/2010 |
| TW | 200709540 | 3/2007 |

OTHER PUBLICATIONS

"First Office Action of China Counterpart Application", issued on Jan. 18, 2012, p. 1-p. 8.
"80mW, Fixed-Gain, Directdrive, Stereo Headphone Amplifier With Shutdown", Maxim Integrated Products, 2006, p. 1-p. 18.

* cited by examiner

*Primary Examiner* — Patricia Nguyen
(74) *Attorney, Agent, or Firm* — Jianq Chyun IP Office

(57) ABSTRACT

An amplifier circuit and a method of signal amplification are provided. The amplifier circuit includes a first amplifier and a charge pump. The first amplifier includes a first terminal, a second terminal, and a third terminal. The first terminal is coupled to a first external voltage. The second terminal is coupled to a negative voltage. The third terminal is coupled to a ground reference voltage. The charge pump is coupled to the first amplifier for providing the negative voltage transformed from a second external voltage.

15 Claims, 4 Drawing Sheets

AMPLIFIER CIRCUIT AND METHOD OF SIGNAL AMPLIFICATION

CROSS-REFERENCE TO RELATED APPLICATION

This application claims the priority benefit of U.S. provisional application Ser. No. 61/138,125, filed on Dec. 17, 2008. The entirety of the above-mentioned patent application is hereby incorporated by reference herein and made a part of this specification.

BACKGROUND OF THE INVENTION

1. Field of the Invention

The present invention relates to an amplifier circuit and a method of signal amplification. More particularly, the present invention relates to signal amplification without using capacitors.

2. Description of the Related Art

FIG. 1 is a schematic diagram showing a conventional amplifier circuit 100 which drives the speakers 121 and 122 of a stereo headphone. The amplifier circuit 100 includes two operational amplifiers (OPAs) 101 and 102. The OPA 101 amplifies the left channel input signal 151 and then outputs the amplified input signal to the left channel speaker 121. The OPA 102 amplifies the right channel input signal 152 and then outputs the amplified input signal to the right channel speaker 122. The power supply voltage of the OPAs 101 and 102 is VDD. The voltage ½ VDD coupled to the positive input terminals of the OPAs 101 and 102 is the reference voltage of the amplification of the input signals 151 and 152. The speakers 121 and 122 are coupled to the 0V ground voltage, while the OPAs 101 and 102 use the voltage ½ VDD as the reference voltage of signal amplification. Due to the difference of voltage levels, the serial capacitors C1 and C2 are required for rejecting DC current.

Unfortunately, the serial capacitors C1 and C2 cause some disadvantages. Firstly, the capacitors C1 and C2 have an adverse impact on the frequency response in the lower frequency band. The high pass filter formed by the capacitors C1 and C2 rejects voices passing through it. Secondly, the capacitors C1 and C2 increase the area and the cost of the circuit layout. In addition, the aforementioned difference of voltage levels charges the capacitors C1 and C2 and produces a pop noise when the amplifier circuit 100 is enabled suddenly. For example, when the user turns on the power of the amplifier circuit 100, the pop noise may be produced and output through the stereo headphone, which is annoying.

SUMMARY OF THE INVENTION

Accordingly, the present invention is directed to an amplifier circuit and a method of signal amplification for the amplifier circuit. The amplifier circuit and the method can amplify input signals without serial capacitors.

According to an embodiment of the present invention, an amplifier circuit is provided. The amplifier circuit includes a first amplifier and a charge pump. The first amplifier includes a first terminal, a second terminal, and a third terminal. The first terminal is coupled to a first external voltage. The second terminal is coupled to a negative voltage. The third terminal is coupled to a ground reference voltage. The charge pump is coupled to the first amplifier for providing the negative voltage transformed from a second external voltage.

The first amplifier may further include a fourth terminal and a fifth terminal. The fourth terminal is coupled to a first input signal. The fifth terminal is coupled to a first speaker.

The amplifier circuit may further include a second amplifier which includes a sixth terminal, a seventh terminal, an eighth terminal, a ninth terminal, and a tenth terminal. The sixth terminal is coupled to the first external voltage. The seventh terminal is coupled to the negative voltage. The eighth terminal is coupled to the ground reference voltage. The ninth terminal is coupled to a second input signal. The tenth terminal is coupled to a second speaker. The first speaker and the second speaker are both coupled to the ground reference voltage.

The absolute value of the negative voltage may be substantially equal to the absolute value of the second external voltage. Alternatively, the absolute values of the negative voltage and the second external voltage may be substantially in a predetermined ratio. The first external voltage and the second external voltage may be equal or not equal.

The amplifier circuit may further include a filter coupled between the charge pump and the first amplifier. The filter filters out noises in the negative voltage and then provides the filtered negative voltage to the first amplifier and the second amplifier. The filter may be a low drop output (LDO) circuit.

According to another embodiment of the present invention, a method of signal amplification for the aforementioned amplifier circuit is provided. The method includes the following steps. Provide a first external voltage and a second external voltage to the amplifier circuit. Provide a negative voltage transformed from the second external voltage to the first amplifier of the amplifier circuit. Provide a ground reference voltage to the first amplifier. Amplify a first input signal received by the first amplifier and output the amplified first input signal. The first external voltage and the negative voltage are operation voltages of the amplifying of the first input signal. The first input signal is amplified based on a ground reference voltage.

The method may further include the step of amplifying a second input signal received by the second amplifier of the amplifier circuit and outputting the amplified second input signal. The first external voltage and the negative voltage are operation voltages of the amplifying of the second input signal. The second input signal is amplified based on the ground reference voltage.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
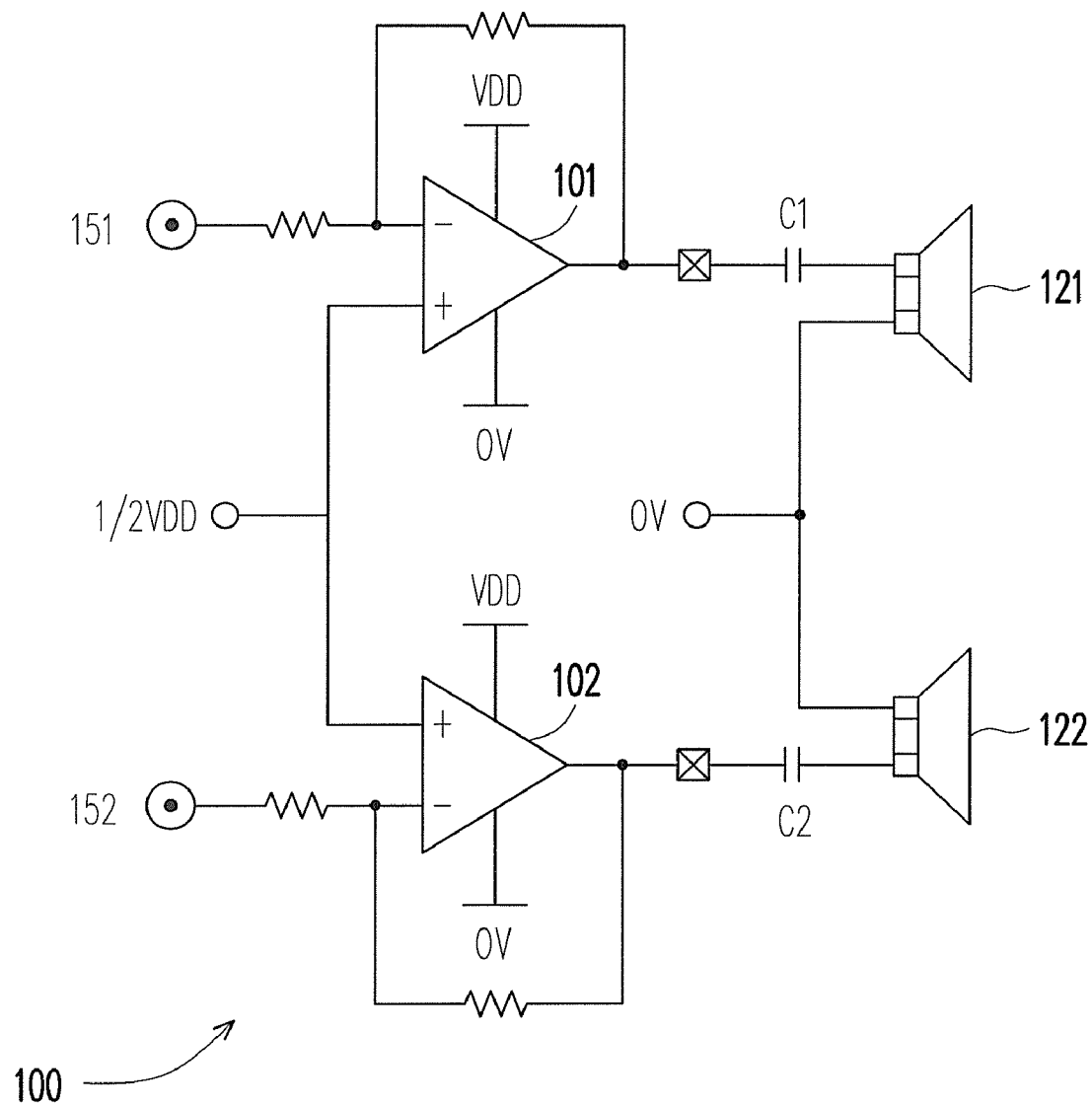
FIG. 1 is a schematic diagram showing a conventional amplifier circuit.
Figure 2:
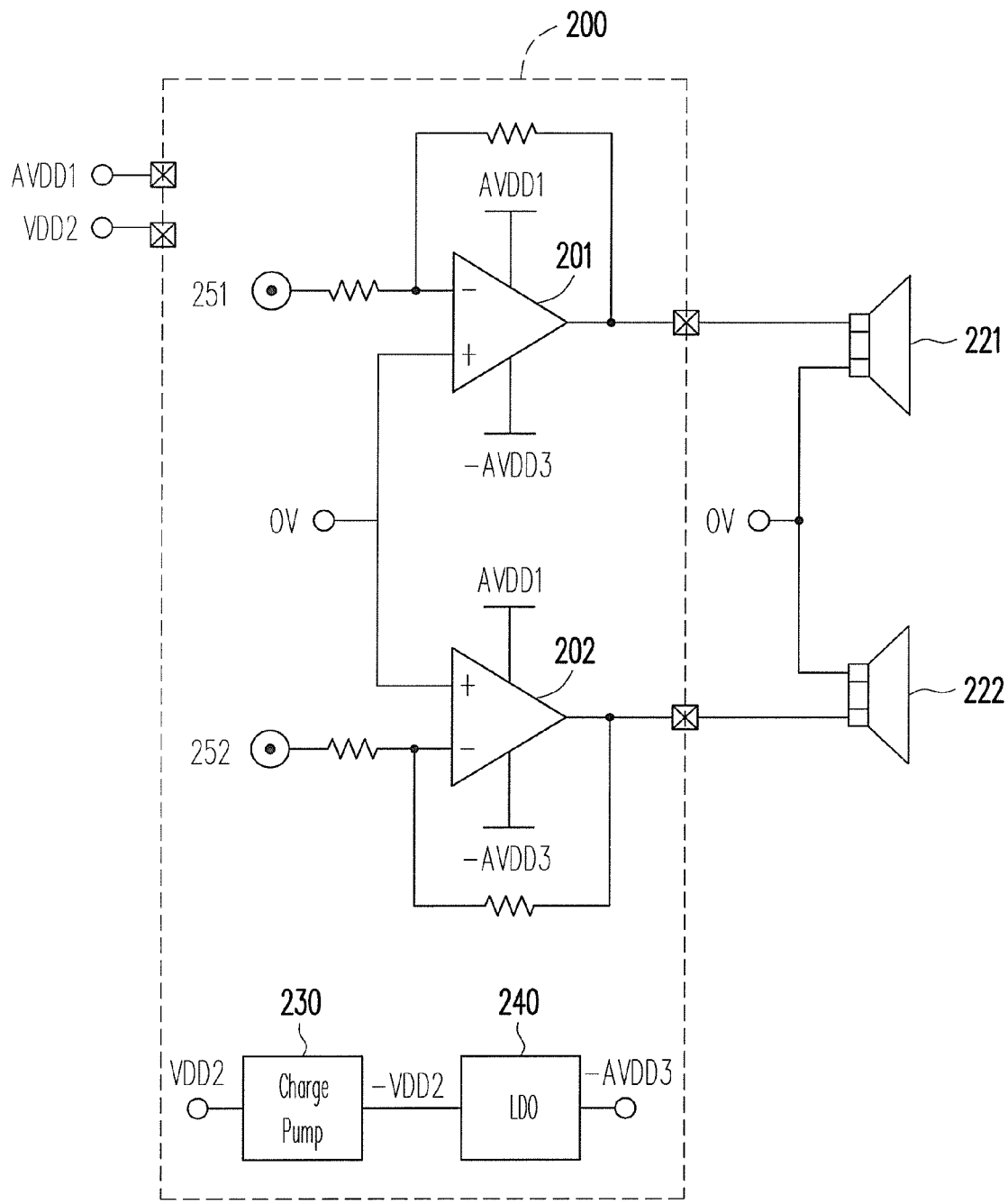
FIG. 2 is a schematic diagram showing an amplifier circuit according to an embodiment of the present invention.

Reference will now be made in detail to the present embodiments of the invention, examples of which are illus- FIG. 2 is a schematic diagram showing an amplifier circuit 200 according to an embodiment of the present invention. The amplifier 200 includes two OPAs 201 and 202, a charge pump 230, and a low drop output (LDO) circuit 240. The amplifier circuit 200 is fabricated in a chip and receives two external voltages AVDD1 and VDD2. The external voltages AVDD1 and VDD2 are provided by circuits outside the amplifier circuit 200.

Each of the OPAs 201 and 202 has five terminals. The positive power terminal of the OPA 201 is coupled to the external voltage AVDD1. The negative power terminal of the OPA 201 is coupled to the negative voltage −AVDD3. Here the term "negative voltage" means a voltage lower than the ground reference voltage (0V). The positive input terminal of the OPA 201 is coupled to the ground reference voltage (0V). The negative input terminal of the OPA 201 is coupled to the input signal 251. The output terminal of the OPA 201 is coupled to the speaker 221. The positive power terminal of the OPA 202 is coupled to the external voltage AVDD1. The negative power terminal of the OPA 202 is coupled to the negative voltage −AVDD3. The positive input terminal of the OPA 202 is coupled to the ground reference voltage (0V). The negative input terminal of the OPA 202 is coupled to the input signal 252. The output terminal of the OPA 202 is coupled to the speaker 222. The speakers 221 and 222 are both coupled to the ground reference voltage (0V). The speakers 221 and 222 may be included in a stereo headphone. The input signals 251 and 252 may be the left channel component and the right channel component of a stereo audio signal, respectively.

The input terminal of the charge pump 230 is coupled to the external voltage VDD2. The input terminal of the LDO circuit 240 is coupled to the output terminal of the charge pump 230. The output terminal of the LDO circuit 240 is coupled to the negative power terminals of the OPAs 201 and 202. The charge pump 230 provides the negative voltage −VDD2 and the LDO circuit 240 provides the negative voltage −AVDD3.

Figure 3A:
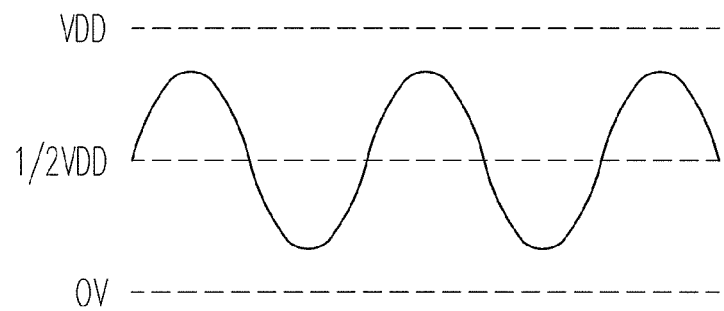
FIG. 3A is a schematic diagram showing an amplified input signal of the amplifier circuit in FIG. 1.
Figure 3B:
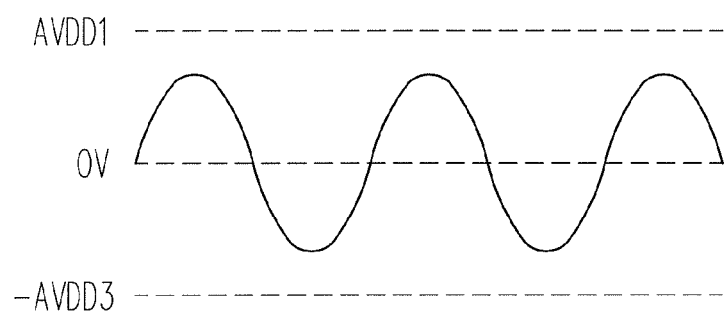
FIG. 3B and FIG. 3C are schematic diagrams showing amplified input signals of the amplifier circuit in FIG. 2.
Figure 3C:
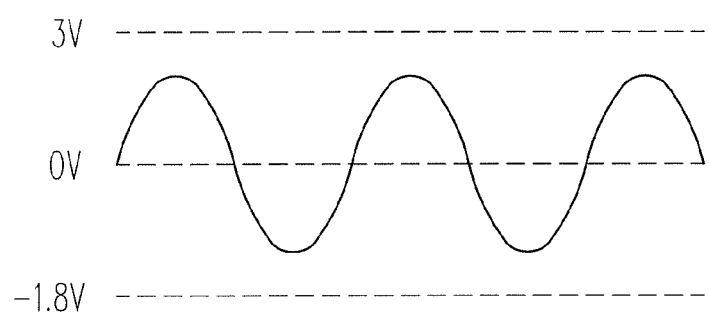

The OPA 201 amplifies the input signal 251 and outputs the amplified input signal 251 to the speaker 221, while the OPA 202 amplifies the input signal 252 and outputs the amplified input signal 252 to the speaker 222. FIG. 3A is a schematic diagram showing an amplified input signal of the conventional amplifier circuit 100. FIG. 3B and FIG. 3C are schematic diagrams showing amplified input signals of the amplifier circuit 200. In the conventional amplifier circuit 100, the power supply voltages of the OPAs 101 and 102 are VDD and 0V. Therefore, the OPAs 101 and 102 have to use the voltage ½ VDD as the reference voltage for input signal amplification, which is different from the ground voltage 0V coupled to the speakers 121 and 122. In the amplifier circuit 200, the power of the OPAs 201 and 202 is supplied by the positive voltage AVDD1 and the negative voltage −AVDD3. Therefore, the OPAs 201 and 202 can use the ground voltage 0V as reference for input signal amplification, which is the same as the ground voltage 0V coupled to the speakers 221 and 222. Since the amplifier circuit 200 does not have the voltage difference problem of the conventional amplifier circuit 100, the amplifier circuit 200 does not need any serial capacitor.

Figure 4:
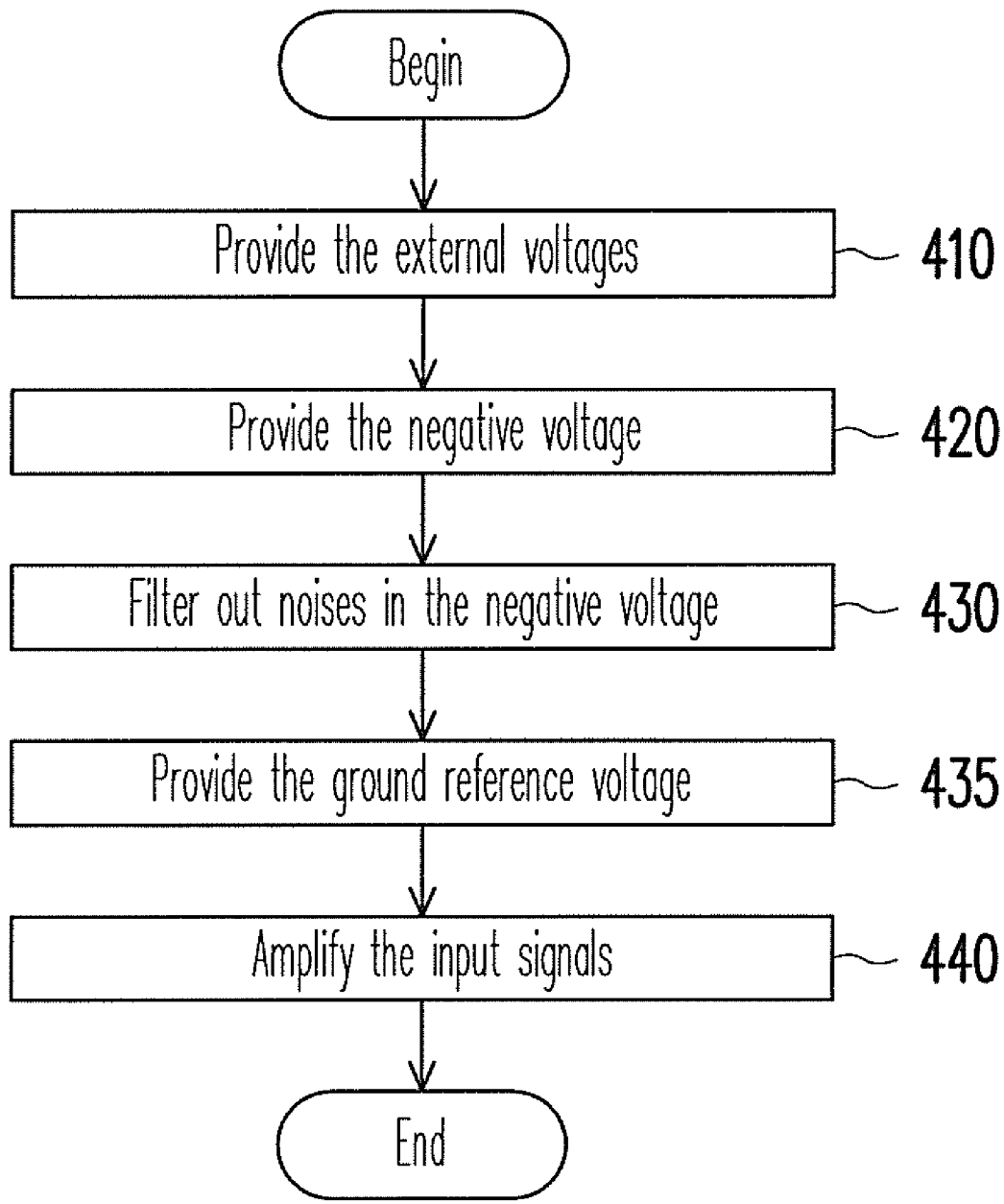
FIG. 4 is a flow chart of a method of signal amplification according to an embodiment of the present invention.

The voltage AVDD1 is an external voltage. The voltage −AVDD3 is transformed from another external voltage VDD2. FIG. 4 is a flow chart of a method of signal amplification executed by the amplifier circuit 200. The flow in FIG. 4 recites the generation of the negative voltage −AVDD3 and the amplification of the input signals 251 and 252.

The flow in FIG. 4 begins at step 410. First, provide the external voltages AVDD1 and VDD2 to the amplifier circuit 200 (step 410). The charge pump 230 transforms the positive external voltage VDD2 into the negative voltage −VDD2 and provides the negative voltage −VDD2 to the LDO circuit 240 (step 420). The absolute values of the voltages VDD2 and −VDD2 are equal.

In some other embodiments of the present invention, the charge pump 230 may cause an offset of the negative voltage. In this case, the absolute value of the negative voltage produced by the charge pump 230 is not equal to the absolute value of the external voltage VDD2 but is still substantially equal to the absolute value of the external voltage VDD2. In some other embodiments of the present invention, the charge pump 230 may convert the external voltage VDD2 according to a predetermined ratio. In this case, the absolute values of the negative voltage and the external voltage VDD2 may be substantially in the predetermined ratio. For example, the absolute value of the negative voltage transformed by the charge pump 230 may be half of the absolute value of the external voltage VDD2.

Next, the LDO circuit 240 filters out noises in the negative voltage −VDD2 and then provides the filtered negative voltage −AVDD3 to the OPAs 201 and 202 (step 430). The filtering performed by the LDO circuit 240 increases the power supply rejection rate (PSRR) of the OPAs 201 and 202. The filtering changes the level of the negative voltage −VDD2 slightly. Still, the negative voltage −AVDD3 is substantially equal to the negative voltage −VDD2. In some other embodiments of the present invention, the LDO circuit 240 may be omitted. In this case, the charge pump 230 provides the negative voltage −VDD2 directly to the negative power terminals of the OPAs 201 and 202. In some other embodiments of the present invention, the LDO circuit 240 may be replaced with any other filtering circuit which is capable of filtering noises in a power supply voltage.

Next, provide the ground reference voltage (0V) to the OPAs 201 and 202 (step 435). Next, the flow proceeds to step 440. The OPA 201 receives and amplifies the input signal 251 and then provides the amplified input signal 251 to the speaker 221. The OPA 202 receives and amplifies the input signal 252 and then provides the amplified input signal 252 to the speaker 222.

The external voltages AVDD1 and VDD2 may be equal. In this case, the voltages AVDD1 and −AVDD3 are substantially equal, as shown in FIG. 3B. Alternatively, the external voltages AVDD1 and VDD2 may be different. For example, AVDD1 may be 3V and VDD2 may be 1.8V, as shown in FIG. 3C. This feature of unequal external voltages provides flexibility and some technical advantages. For example, if the two external voltages have to be equal and each of the two external voltages is 3V, the 6V voltage across the two power terminals of the OPAs 201 and 202 could cause high voltage stress on gate oxide fabricated with advanced processes and damage the transistors of the OPAs permanently. In the example of FIG. 3C, due to unequal external voltages, the voltage across the two power terminals of the OPAs 201 and 202 is only 4.8V, which does not cause the high voltage stress.

In summary, the amplifier circuit 200 receives two external voltages, provides the first external voltage to the OPAs as a power supply voltage, generates a negative voltage transformed from the second external voltage, and then provides the negative voltage to the OPAs as another power supply voltage. Therefore, the OPAs can use the ground voltage as reference and the serial capacitors are no longer necessary. The removal of the capacitors not only reduces area and cost of the entire system, but also eliminates the annoying charging noise and the other drawbacks of the capacitors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An amplifier circuit, comprising:
    a first amplifier, comprising a first terminal, a second terminal, a third terminal, a fourth terminal, and a fifth terminal, wherein the first terminal is coupled to a first external voltage, the second terminal is coupled to a negative voltage, the third terminal is coupled to a ground reference voltage, the fourth terminal is coupled to a first input signal, the fifth terminal is coupled to a first speaker;
    a second amplifier, comprising a sixth terminal, a seventh terminal, an eighth terminal, a ninth terminal, and a tenth terminal, wherein the sixth terminal is coupled to the first external voltage, the seventh terminal is coupled to the negative voltage, the eighth terminal is coupled to the ground reference voltage, the ninth terminal is coupled to a second input signal, the tenth terminal is coupled to a second speaker; and
    a charge pump, coupled to the first amplifier and the second amplifier, providing the negative voltage transformed from a second external voltage.

2. The amplifier circuit of claim 1, wherein the first speaker and the second speaker are both coupled to the ground reference voltage.

3. The amplifier circuit of claim 1, wherein the first amplifier amplifies the first input signal and outputs the amplified first input signal to the first speaker, the second amplifier amplifies the second input signal and outputs the amplified second input signal to the second speaker.

4. The amplifier circuit of claim 1, wherein an absolute value of the negative voltage is substantially equal to an absolute value of the second external voltage.

5. The amplifier circuit of claim 1, wherein an absolute value of the negative voltage and an absolute value of the second external voltage are substantially in a predetermined ratio.

6. The amplifier circuit of claim 1, wherein the first external voltage and the second external voltage are not equal.

7. The amplifier circuit of claim 1, further comprising:
    a filter, coupled between the charge pump, the first amplifier and the second amplifier, filtering out noises in the negative voltage and then providing the filtered negative voltage to the first amplifier and the second amplifier.

8. The amplifier circuit of claim 7, wherein the filter is a low drop output circuit.

9. A method of signal amplification for an amplifier circuit which has a first amplifier and a second amplifier, comprising:
    providing a first external voltage and a second external voltage to the amplifier circuit;
    providing a negative voltage transformed from the second external voltage to the first amplifier and the second amplifier;
    providing a ground reference voltage to the first amplifier and the second amplifier;
    amplifying a first input signal received by the first amplifier and outputting the amplified first input signal; and
    amplifying a second input signal received by the second amplifier and outputting the amplified second input signal.

10. The method of claim 9, further comprising:
    outputting the amplified first input signal to a first speaker and outputting the amplified second input signal to a second speaker.

11. The method of claim 10, wherein the first speaker and the second speaker are both coupled to the ground reference voltage.

12. The method of claim 9, wherein an absolute value of the negative voltage is substantially equal to an absolute value of the second external voltage.

13. The method of claim 9, wherein an absolute value of the negative voltage and an absolute value of the second external voltage are substantially in a predetermined ratio.

14. The method of claim 9, wherein the first external voltage and the second external voltage are not equal.

15. The method of claim 9, further comprising:
    filtering out noises in the negative voltage and then providing the filtered negative voltage to the first amplifier and the second amplifier.

* * * * *